United States Patent [19]
Yun et al.

[11] Patent Number: 5,803,697
[45] Date of Patent: Sep. 8, 1998

[54] CHARGER ASSEMBLY FOR A WAFER CARRYING APPARATUS

[75] Inventors: Jung-Bong Yun; Gee-Ill Seo; Hee-Jun Kim, all of Kyungki-do, Rep. of Korea

[73] Assignee: Samsung Electronics Co., Ltd., Suwon, Rep. of Korea

[21] Appl. No.: 774,274

[22] Filed: Dec. 27, 1996

[30] Foreign Application Priority Data

Dec. 29, 1995 [KR] Rep. of Korea ...................... 95-67538

[51] Int. Cl.⁶ ................................. B65G 65/02
[52] U.S. Cl. .......................... 414/417; 414/938
[58] Field of Search ................... 414/404, 416, 414/417, 935, 937, 938; 198/468.3, 468.6

[56] References Cited

U.S. PATENT DOCUMENTS

| | | | |
|---|---|---|---|
| 3,209,923 | 10/1965 | Bargel et al. | 198/468.3 X |
| 3,805,943 | 4/1974 | Warren | 198/468.3 X |
| 4,957,406 | 9/1990 | Akagawa | 414/404 X |
| 5,007,788 | 4/1991 | Asano et al. | 414/404 X |
| 5,125,784 | 6/1992 | Asano | 414/404 |
| 5,188,499 | 2/1993 | Tarng et al. | 414/417 X |
| 5,269,643 | 12/1993 | Kodama et al. | 414/938 X |
| 5,299,901 | 4/1994 | Takayama | 414/938 X |
| 5,501,568 | 3/1996 | Ono | 414/938 X |
| 5,632,080 | 5/1997 | Harman et al. | 198/468.6 X |
| 5,655,871 | 8/1997 | Ishii et al. | 414/937 X |

FOREIGN PATENT DOCUMENTS 122234   5/1988   Japan ................................ 414/938

*Primary Examiner*—David A. Bucci
*Attorney, Agent, or Firm*—Jones & Volentine, L.L.P.

[57] ABSTRACT

A charger assembly for a wafer carrying apparatus, includes a charger for conveying wafers loaded in a plurality of grooves of a boat to a subsequent manufacturing process. The charger has a plurality of wafer guiders disposed side by side and has a first gap therebetween. The charger further includes an adjusting structure by which the first gap between the plurality of guiders is aligned with a second gap formed between groove groups of the boat. A pair of supporting members are detachably attached to the wafer guiders by fasteners to allow lateral movement of the wafers guiders to ensure correct alignment of the grooves of the boat and charger.

7 Claims, 7 Drawing Sheets

CHARGER ASSEMBLY FOR A WAFER CARRYING APPARATUS

BACKGROUND OF THE INVENTION

1. Field of the Invention

The present invention relates to a charger assembly for a wafer carrying apparatus. More particularly, it relates to a charger assembly in which a wafer is retracted from or loaded onto a wafer carrying apparatus such as boat or carrier.

2. Description of the Related Art

A wafer loading apparatus, which is part of a photoresist stripping apparatus, can damage or break the wafers when the element that delivers the wafer is not properly aligned with the receiving element. The damage to the wafer is caused by a spacing defect between the wafer guiders of the charger assembly.

FIGS. 4 to 7 show schematically the structure of a conventional wafer carrying apparatus. The wafer carrying or conveying apparatus comprises a pair of boats 200, each of which has a plurality of grooves 200a for holding a plurality of wafers 400 that are drawn from the reaction chamber (not shown). The wafers 400 are inserted in the groves 200a in the boats 200 in parallel with one another. A pusher 300 is disposed beneath the boat 200 and raises the wafers 400 into the grooves 200a in the boat 200.

The wafer carrying apparatus further comprises a charger assembly 100, into which the wafers 400 lifted by the pusher 300 are loaded. The charger assembly 100 comprises a charger 110 into which the pusher 300 guides and loads the wafers 400, and a hanger 120 which prevents the loaded wafers 400 from falling out of the charger 110.

Further, the charger 110 comprises a pair of supporting members 111 facing inward along its longitudinal upper edges, and a pair of wafer guiders 112 downwardly extended from the lower end of each supporting member 111. Each wafer guider 112 has a plurality of grooves 112a formed longitudinally therein.

In the conventional apparatus, the wafers 400 loaded on the boat 200 are raised by the pusher 300 and guided into the grooves 112a. Upon arriving at a predetermined point, the pair of hangers 120 close in upon the guiders 112. The lower portions of the hangers 120 interlace with the guiders 112 and protrude into the interior of the charger assembly 110, thereby holding the wafers 400 in place as the charger assembly is carried away from the boat 200 to the next process.

FIG. 5 is a side elevational view of the charger 110. The Teflon coated wafer guider 112 is integrally formed with the supporting member 111 at the supporting member's lower edge. On the inside surface of the guider 112 a plurality of grooves 112a are formed evenly spaced from one another. A first or left group 112L of the grooves 112a is spaced from a second or right group 112R of the grooves 112a by a predetermined gap 'a'. In the same fashion, another predetermined gap 'b' (see FIG. 6A) is formed at the middle of the boat 200.

FIGS. 6A and 6B illustrate the spatial relationship between the charger 110 and the boat 200. For the boat 200 to properly deliver its wafer 400 into the guiders 112, the grooves 112a of the charger 110 must be aligned with the grooves 200a of the boat 200. More specifically, the gap 'a' between the left and right groups 112L and 112R of the guider 112 should be aligned with the gap 'b' between the left and right groups 200L and 200R of the boat 200.

With reference to FIGS. 6A and 6B, when the lower end of the charger 110 is adjacent to the boat 200, if the gap 'a' between the two groove groups 112L and 112R is not aligned with the gap 'b' of the boat 200, the grooves 200a of the boat 200 and the grooves 112a of the guider 112 will also not be aligned.

The misalignment of the grooves 112a and 200a can occur if there exists a manufacturing error in either the charger 110 or the boat 200. The only post-production method to realign the groove of the defective part would be to vary the width of the gap between each groups of grooves 112L and 112R.

However, in the conventional assembly 100, since each wafer guider 112 is fixedly mounted to the supporting member 111, it is impossible to do so. As is evident, the alignment of one of the boats 200 groove groups 200L or 200R of the guiders would create a misalignment in the other pair of groove groups (see FIG. 6A), and the centering of the two gaps 'a' and 'b' with respect to each other would only serve to misalign both groove group pairs (see FIG. 6B).

FIGS. 7A and 7B illustrate the misalignment between the charger 110 and the boat 200 in a defective conventional apparatus. The difference in width between the gap 'a' formed on the wafer guider 112 and the gap 'b' on the boat 200 slightly offsets the grooves 112a of the guider 112 from the grooves 200a of the boat 200. A wafer 400 in the groove 200a inserted into the groove 112a of the guider 112 by the pusher 300 is broken in the process by the misalignment of the grooves.

Additionally, the flying particles generated from the wafer breakage contaminate not only the other wafers being carried, but the carrying apparatus itself, precipitating its malfunction. These unfavorable circumstances can cause a malfunction in follow-on processes to be performed on the wafers and decrease the operating efficiency of the entire apparatus.

Also, there is additional required downtime and manpower for removing contaminants from the assembly, thereby causing additional economic loss.

SUMMARY OF THE INVENTION

The present invention substantially overcomes the above-mentioned problems of the conventional art by introducing a modified wafer charger assembly.

An object of the present invention is to provide a wafer assembly by which, during the photoresist stripping process, errors in wafer loading due to a spacing defect are prevented, thereby increasing the operating efficiency and productivity of the apparatus.

In order to achieve these and other objects and advantages, and in accordance with the purpose of the present invention as embodied and broadly described herein, the present invention provides for a charger assembly for a wafer carrying apparatus, comprising: a charger for conveying wafers loaded in a plurality of grooves of a boat to a subsequent manufacturing process, the charger comprising a plurality of wafer guiders disposed side by side and having a first gap therebetween, each of the wafer guiders having a plurality of grooves extending longitudinally therein for receiving the wafers, and the charger further comprising an adjusting means by which the first gap between the plurality of guiders is aligned with a second gap formed between groove groups of the boat.

The adjusting means comprises a plurality of respective protrusions formed on each adjacent side surface of the plurality of wafer guiders, a pair of supporting members detachably attached to the wafer guiders by a fastening means, the supporting members having a T-shape comprising an upper horizontal portion and a central vertical portion; and a first plurality of openings formed on an upper portion of the wafer guiders, the first plurality of openings being in relative alignment with a respective second plurality of openings formed on the upper horizontal portion of the supporting members, for adjusting the first gap between the wafer guiders. The first plurality of openings comprises evenly spaced apart slots of a predetermined length formed at the upper portion of the wafer guiders.

The adjusting means further comprises a third plurality of openings formed on the central vertical portion of the supporting members, communicating with a fourth plurality of openings formed between the plurality of respective protrusions formed on each adjacent side surface of the plurality of wafer guiders when the protrusions of the wafer guiders are interlaced.

The fastening means comprises a first plurality of fasteners communicating with the first and second plurality of openings, and a second plurality of fasteners communicating with the third and fourth plurality of openings, whereby the adjusting and fastening means allow lateral movement of the wafer guiders prior to fixedly securing the wafers guiders.

Accordingly, the present apparatus prevents damage to the wafers due to a defective part which misaligns the grooves of the boat with that of the charger during the photoresist stripping process. Thus, the operating efficiency of the apparatus and the productivity of the apparatus are increased.

DESCRIPTION OF BRIEF THE DRAWINGS

The foregoing and other objects, aspects, and advantages will be better understood from the following detailed description of the embodiments of the invention with reference to the drawings, in which.

DESCRIPTION OF THE PREFERRED EMBODIMENTS

Figure 1:
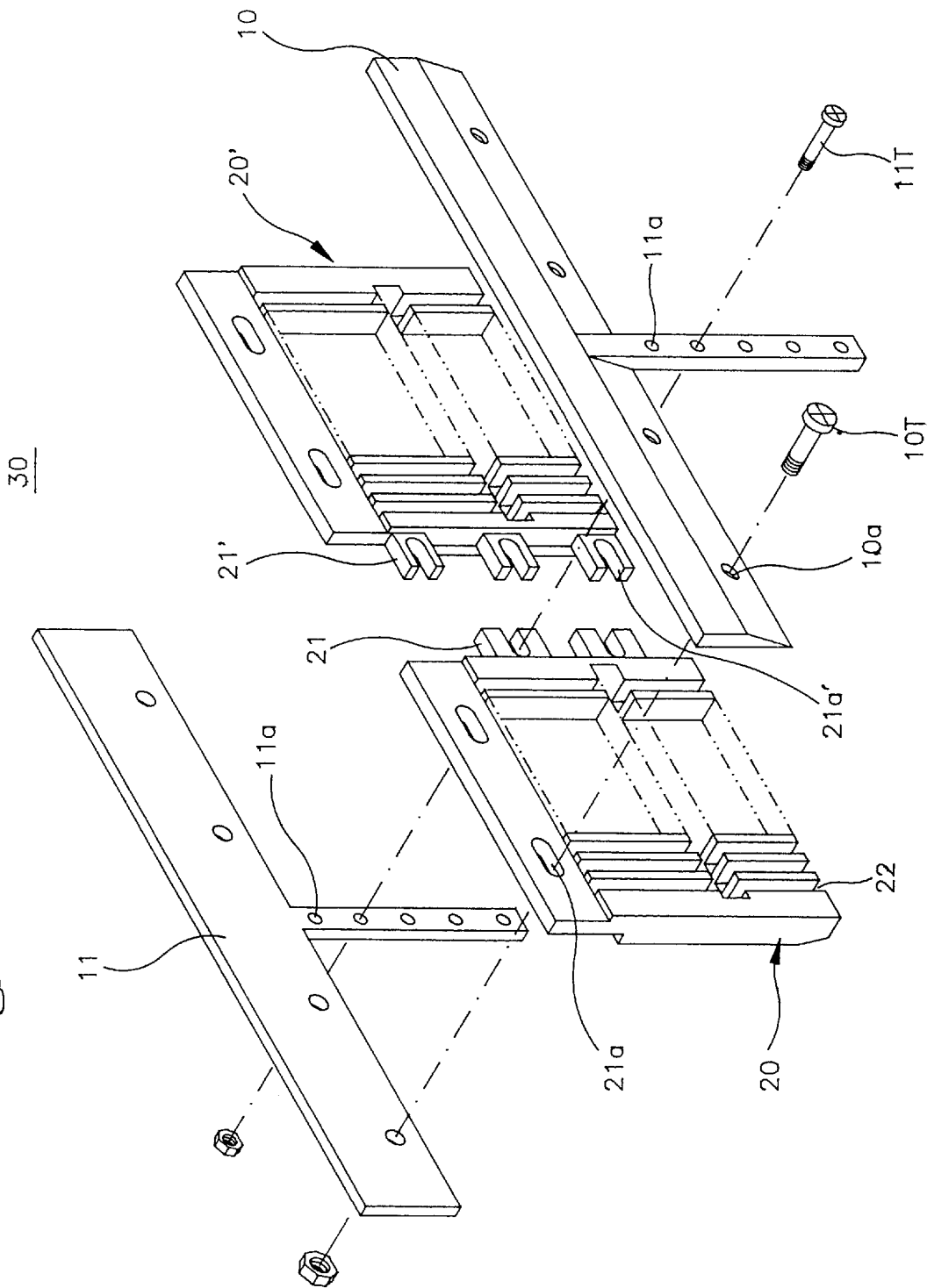
FIG. 1 is a perspective view of a charger for a wafer in accordance with the present invention.
Figure 2:
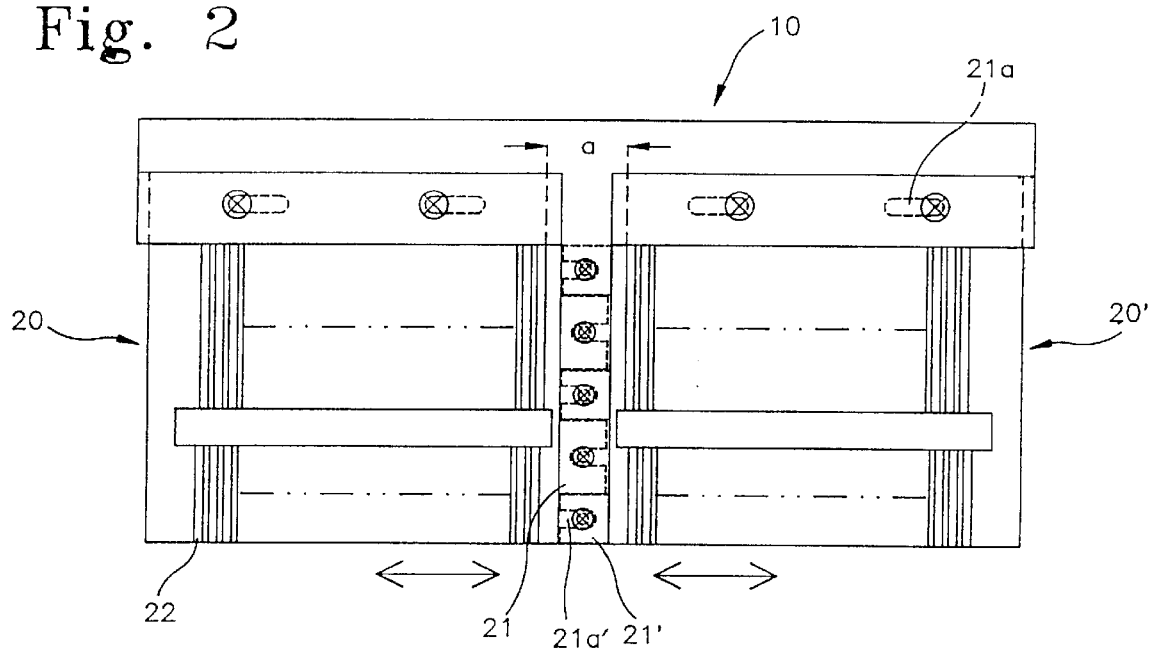
FIG. 2 is a side elevational view of the charger of FIG. 1 in an interconnected arrangement.

The preferred embodiments of the present invention will now be discussed in detail with reference to FIGS. 1–3.

A charger 30 comprises two pairs of T-shaped supporting members 10 and 11, each of which has a pair of wafer guiders 20 and 20' disposed disassembled between the supporting members 10 and 11. For simplicity, in the illustrated embodiment only one pair of wafer guiders 20 and 20' are shown connected to the front or right supporting member 10.

On the surface of each wafer guider 20 and 20', a plurality of grooves 22 are longitudinally formed, into which the wafers are delivered. Each wafer guider 20 and 20' further has a plurality of protrusions 21 and 21' on its inside vertical edge. The protrusions 21 of one wafer guider 20 are disposed to interlace with those protrusions 21' of the other wafer guider 20' when the guiders are brought in contact with each other.

Portions of the wafer guiders 20 and 20' and protrusions 21 and 21' comprise an adjusting means, which serves to fasten the wafer guiders 20 and 20' to the supporting member 10 and to adjust the pitch of the gap 'a' (see FIG. 2) formed between the wafer guiders 20 and 20'.

The adjusting means comprises slots 21a evenly spaced at the upper end of the wafer guiders 20 and 20' and notches 21a' formed by the protrusions 21 and 21'. Each fastening member 10T passes through the hole 10a formed in the horizontal portion of the supporting member 10 and then through the slot 21a. In the same way, each fastening member 11T passes through the holes 11a formed in the vertical portion of the supporting member 10 and then through the slot 21a'. Thereby, the assembly of the wafer guiders 20 and 20' and the supporting member 10 is achieved. The wafer guider 20 and 20' can move laterally or horizontally along the slot 21a and notches 21a' to adjust the gap 'a' between the wafer guiders 20 and 20'.

Figure 3A:
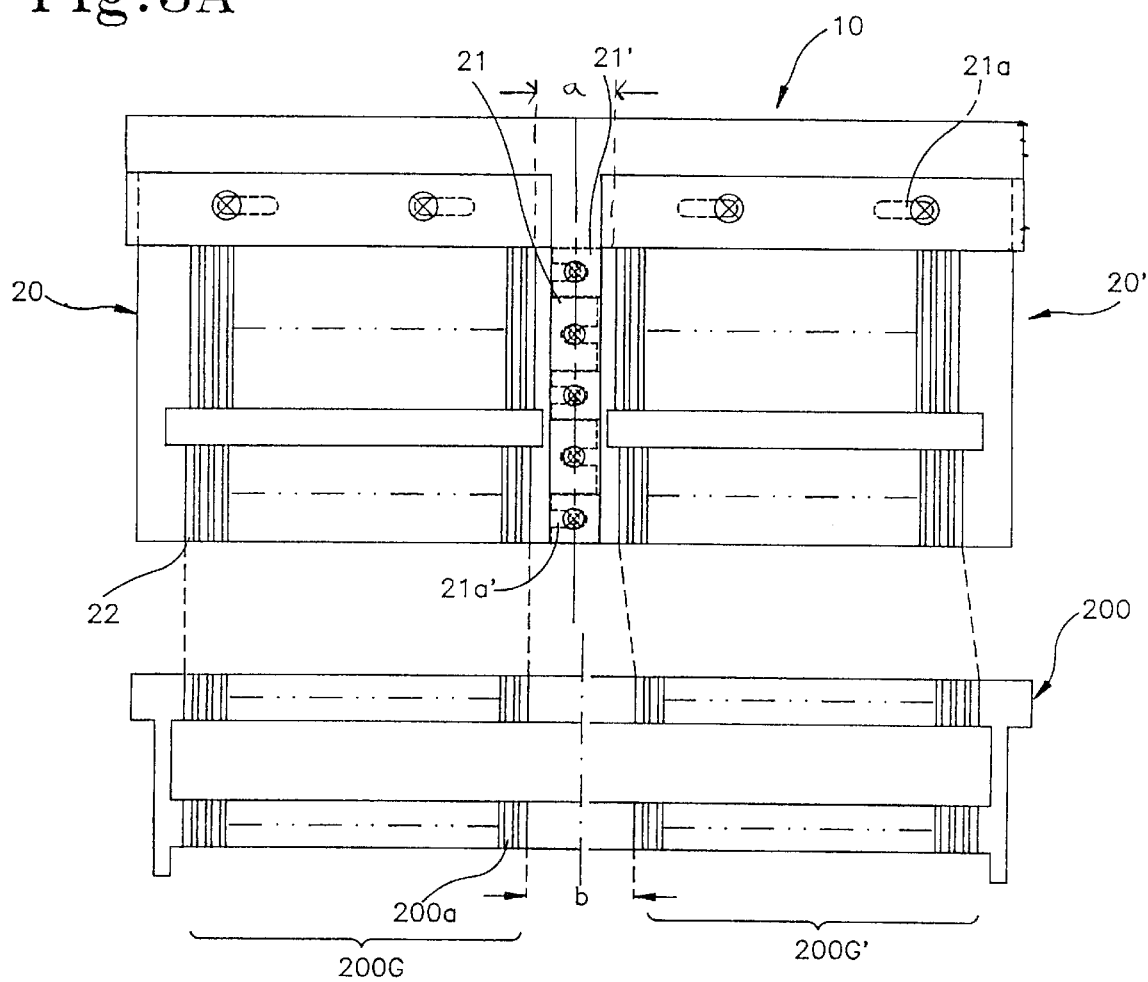
FIG. 3A is a schematic side elevational view of the charger in an interconnected arrangement and the boat of the wafer carrying apparatus of FIG. 1 before adapting a pitch alignment.

As shown in FIG. 3A, should the gap 'a' between each wafer guider 20 and 20' and the gap 'b' between the groove group 200G and 220G' be misaligned with respect to the charger and the boat, or should the gaps 'a' and 'b' not be of the same size due to a manufacturing error, the resulting problems can be avoided by the following procedure.

Figure 3B:
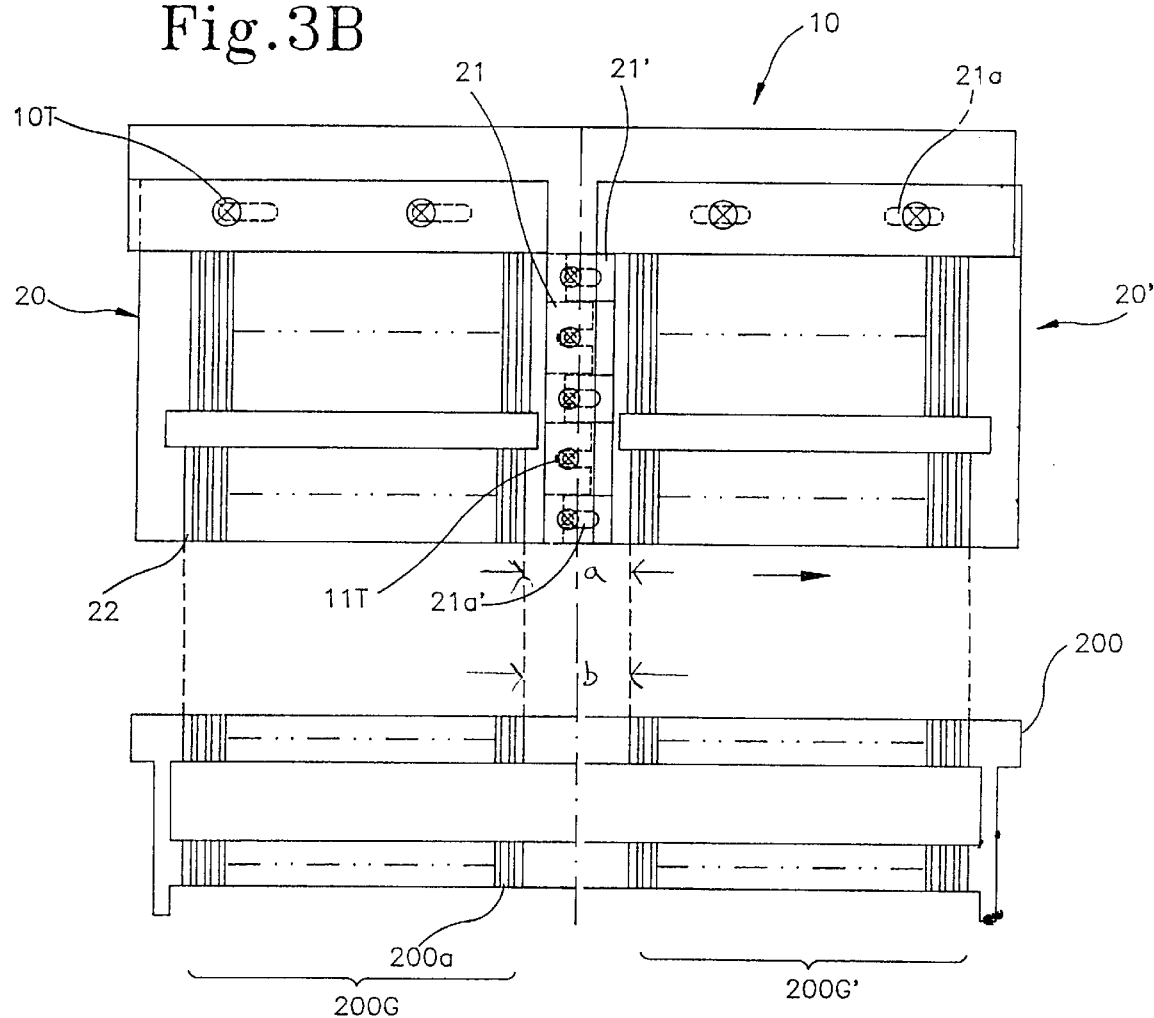
FIG. 3B is a schematic side elevational view of the charger in an interconnected arrangement and the boat of FIG. 1 after adapting a pitch alignment.
Figure 4:
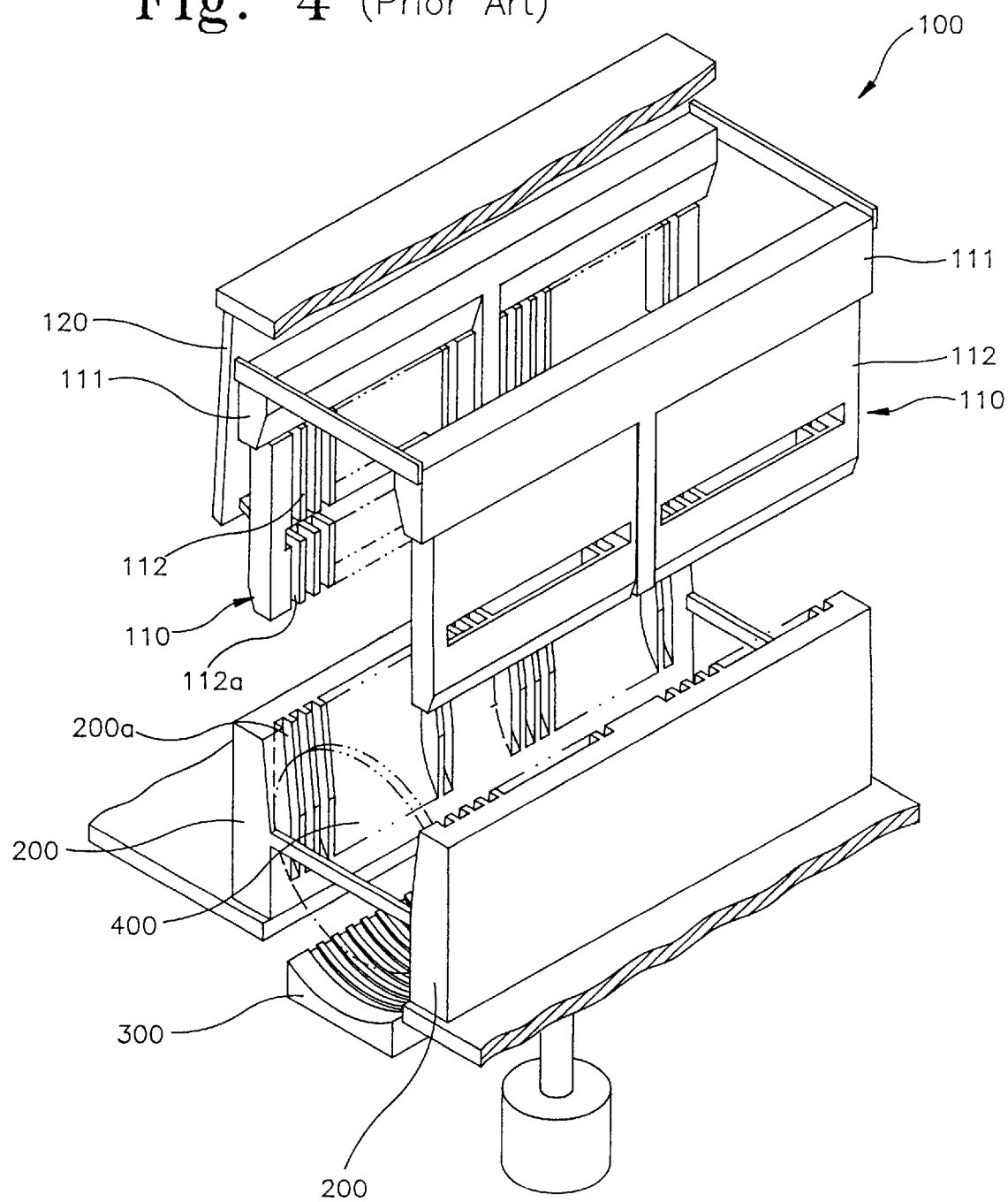
FIG. 4 is a perspective exploded view of a wafer carrying apparatus is accordance with the conventional art.
Figure 5:
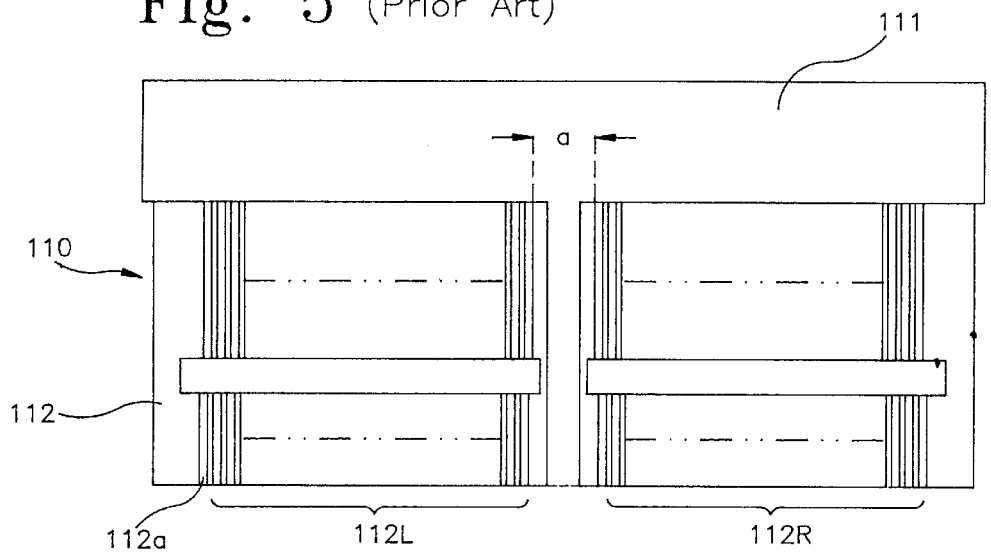
FIG. 5 is a side elevational view of the charger of FIG. 4.
Figure 6A:
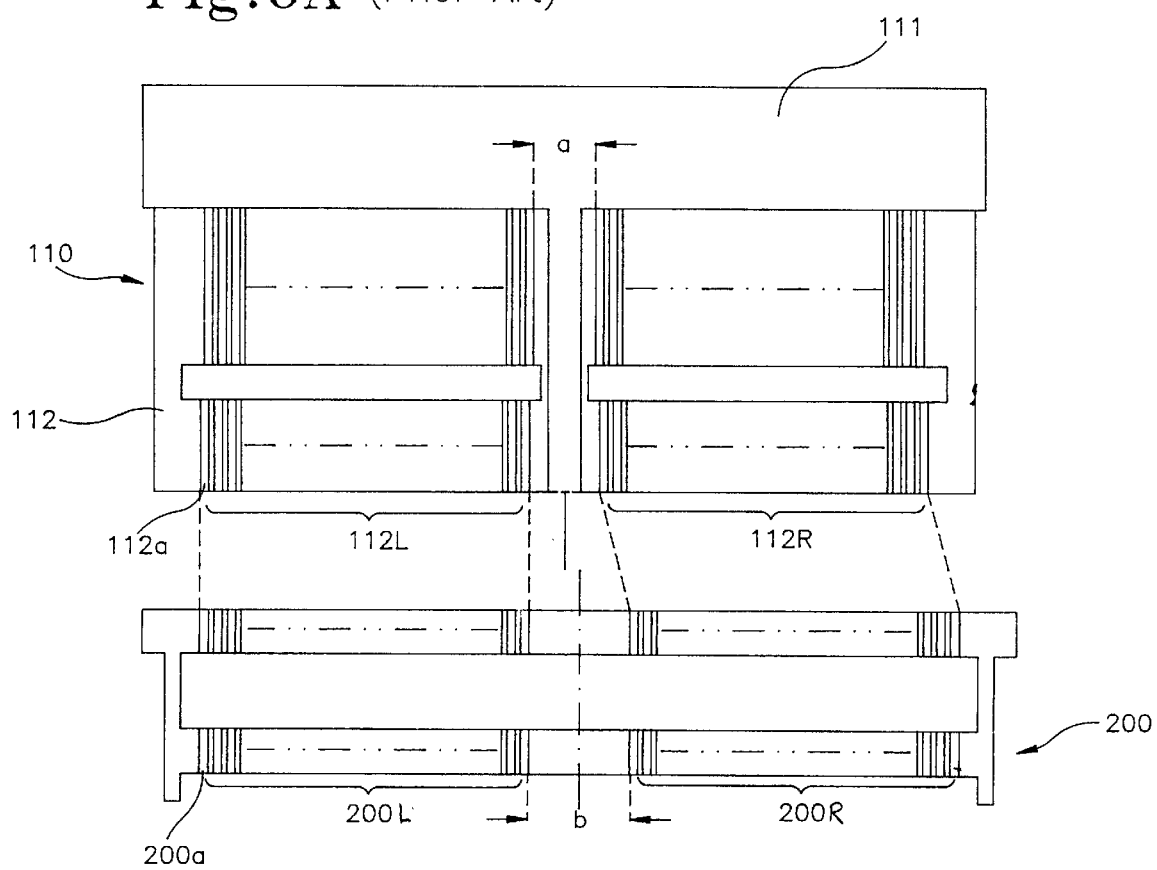
FIGS. 6A and 6B are side elevational views of the charger and the boat of FIG. 4 illustrating the pitch relationship therebetween.
Figure 6B:
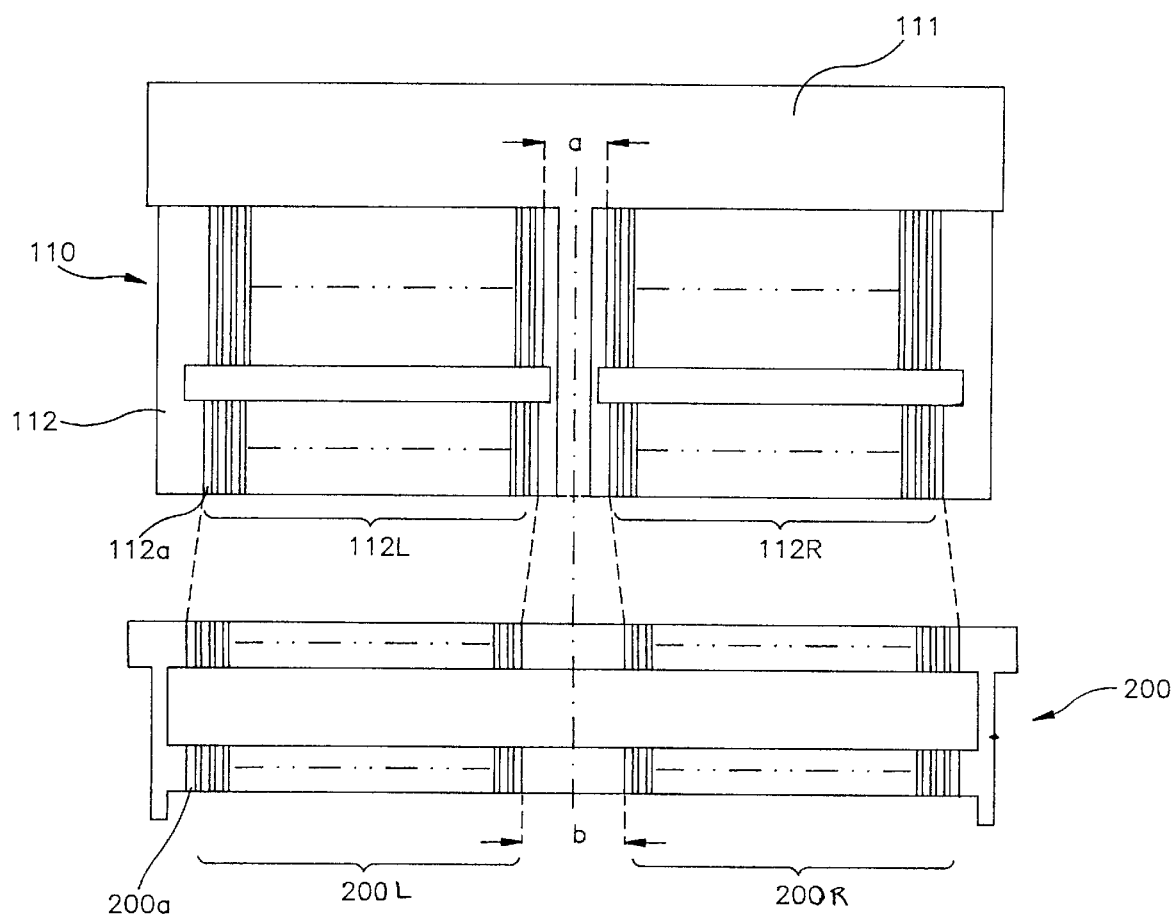
Figure 7A:
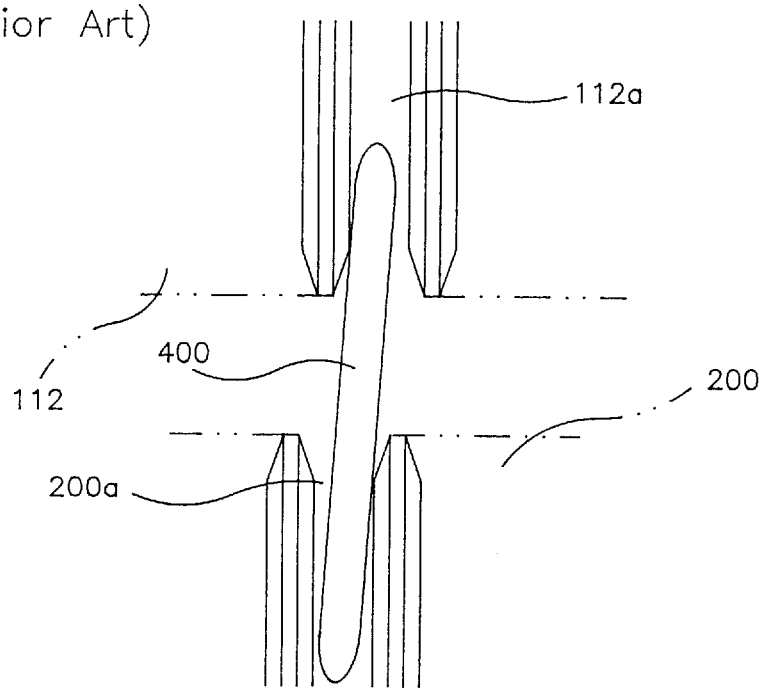
FIGS. 7A and 7B are schematic side elevational views of the broken wafer caused by the misalignment between the charger and the boat in a defective conventional apparatus.
Figure 7B:
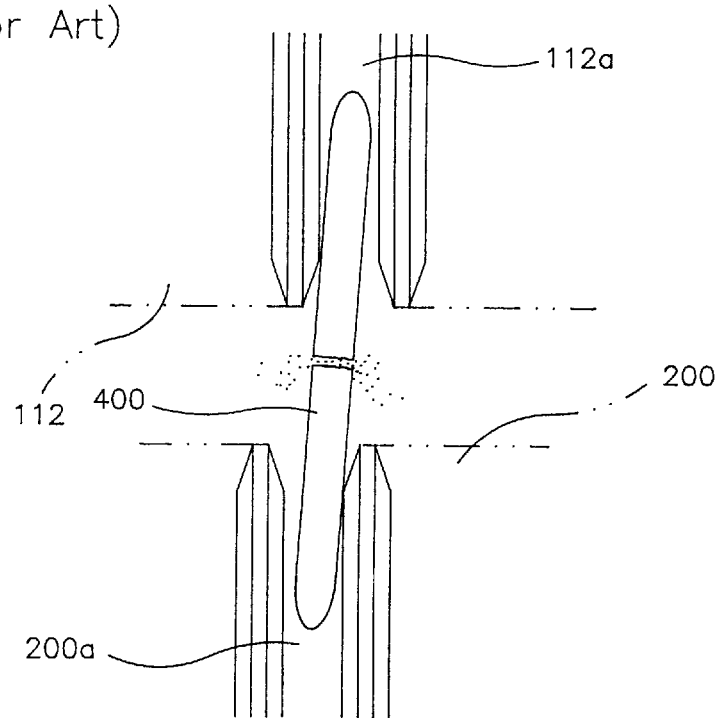

First, referring to FIG. 3B, the fastening members 10T and 11T are loosened so as to allow the horizontal movement of the wafer guiders 20 and 20'. The wafer guiders 20 and 20' are then repositioned so as to resize or relocate the gap 'a' between them.

The fastening members 10T and 11T are then retightened to firmly hold the wafer guiders 20 and 20' in their new position. Thereafter, the conveying process in which the wafers are located into the grooves 22 is executed.

With the present invention, the gap 'a' between the wafer guiders 20 and 20' is easily adjusted with respect to the gap 'b' between the groove groups 200G and 200G' on the boat 200. Thus, the damage to the wafers by either the misalignment or the different sizing of the gaps is prevented.

Further, the aforementioned problems arising from the breaking of wafers are avoided. Contamination of both the conveyor and the process machine is effectively averted, allowing for the smooth operation of present and follow-on processes. This reduces the number of man-hours and the amount of downtime required to produce wafers, thereby decreasing production costs and increasing the quality of the end product.

It will be apparent to those skilled in the art that various modifications and variations can be made in the system and method of the present invention without departing from the spirit or scope of the invention. Thus, it is intended that the present invention cover the modifications and variations of this invention provided they come within the scope of the appended claims and their equivalents.

What is claimed is:

1. A charger assembly for a wafer carrying apparatus, comprising:

a charger disposed directly above a wafer boat, which wafer boat has a plurality of groove groups for holding wafers, the charger conveying the wafers loaded in the plurality of grooves of the boat to a subsequent manufacturing process, said charger comprising a plurality of wafer guiders disposed side by side in a horizontal line above the wafer boat, said wafer guiders having a first gap therebetween, each of said wafer guiders having a plurality of grooves extending longitudinally therein for receiving the wafers from the wafer boat, and an adjusting means by which a center line of the first gap, formed between said plurality of wafer guiders, is vertically aligned with a center line of a second gap, formed between the plurality of groove groups of the wafer boat, thereby vertically aligning the plurality of wafer guiders disposed above the wafer boat, each holding a plurality of wafers, with the plurality of groove groups of the wafer boat.

2. The charger assembly as set forth in claim 1, wherein the adjusting means comprises a plurality of respective protrusions formed on each adjacent side surface of said plurality of wafer guiders;

a pair of supporting members detachably attached to said wafer guiders by a fastening means, said supporting members having a T-shape comprising an upper horizontal portion and a central vertical portion; and a first plurality of openings formed on an upper portion of said wafer guiders, said first plurality of openings being in relative alignment with a respective second plurality of openings formed on the upper horizontal portion of the supporting members, for adjusting the first gap between the wafer guiders.

3. The charger assembly as in claim 2, wherein said first plurality of openings comprises evenly spaced apart slots of a predetermined length formed at the upper portion of the wafer guiders.

4. The charger assembly of claim 3, said adjusting means further comprising a third plurality of openings formed on the central vertical portion of the supporting members.

5. The charger assembly of claim 4, wherein said third plurality of openings communicate with a fourth plurality of openings formed between the plurality of respective protrusions formed on each adjacent side surface of said plurality of wafer guiders when the protrusions of the wafer guiders are interlaced.

6. The charger assembly of claim 5, said fastening means comprising a first plurality of fasteners communicating with the first and second plurality of openings, and a second plurality of fasteners communicating with the third and fourth plurality of openings, said adjusting means allowing lateral movement of the wafer guiders to align the first gap between a plurality of wafer guiders disposed side by side, and the second gap formed between the groove groups of the boat, by loosening said first and second plurality of fasteners prior to fixedly securing the wafer guiders.

7. A charger assembly for a wafer carrying apparatus, comprising:

a charger disposed directly above a wafer boat, which wafer boat has a plurality of groove groups for holding wafers, the charger conveying the wafers loaded in the plurality of grooves of the boat to a subsequent manufacturing process, said charger comprising a plurality of wafer guiders disposed side by side in a horizontal line above the wafer boat, said wafer guiders having a first gap therebetween, each of said wafer guiders having a plurality of grooves extending longitudinally therein for receiving the wafers from the wafer boat, and an adjusting means by which the first gap, formed between said plurality of wafer guiders, is resized to correspond to a size of, and be vertically aligned with, a second gap, formed between the plurality of groove groups of the wafer boat, thereby vertically aligning the plurality of wafer guiders disposed above the wafer boat, each holding a plurality of wafers, with the plurality of groove groups of the wafer boat.

* * * * *